United States Patent
Koshiyama et al.

(10) Patent No.: US 7,741,260 B2
(45) Date of Patent: *Jun. 22, 2010

(54) RINSING FLUID FOR LITHOGRAPHY

(75) Inventors: Jun Koshiyama, Kawasaki (JP); Kazumasa Wakiya, Kawasaki (JP); Fumitake Kaneko, Kawasaki (JP); Atsushi Miyamoto, Kawasaki (JP); Hidekazu Tajima, Kawasaki (JP); Yoshihiro Sawada, Kawasaki (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 568 days.

This patent is subject to a terminal disclaimer.

(21) Appl. No.: 11/587,268

(22) PCT Filed: Apr. 20, 2005

(86) PCT No.: PCT/JP2005/007504

§ 371 (c)(1),
(2), (4) Date: Oct. 23, 2006

(87) PCT Pub. No.: WO2005/103831

PCT Pub. Date: Nov. 3, 2005

(65) Prior Publication Data

US 2008/0026975 A1    Jan. 31, 2008

(30) Foreign Application Priority Data

Apr. 23, 2004  (JP) ............................ 2004-129096

(51) Int. Cl.
*C11D 7/32* (2006.01)
(52) U.S. Cl. .................. 510/175; 429/307; 429/336; 430/319; 430/324; 430/327; 430/331; 522/25; 526/220
(58) Field of Classification Search ............ 252/62.2, 252/170, 500; 430/319, 324, 327, 331; 510/170, 510/175; 429/307, 336; 522/25; 526/220; 134/30; 514/184; 562/30; 508/568; 564/82
See application file for complete search history.

(56) References Cited

U.S. PATENT DOCUMENTS

| | | | | |
|---|---|---|---|---|
| 2,701,814 A * | 2/1955 | Smith et al. | ........... | 564/209 |
| 2,732,398 A * | 1/1956 | Brice et al. | ........... | 562/30 |
| 4,031,036 A * | 6/1977 | Koshar | ........... | 526/220 |
| 4,387,222 A | 6/1983 | Koshar | | |
| 4,784,937 A * | 11/1988 | Tanaka et al. | ........... | 430/331 |
| 5,021,308 A * | 6/1991 | Armand et al. | ........... | 429/336 |
| 5,326,672 A | 7/1994 | Tanaka et al. | | |
| 5,541,235 A * | 7/1996 | Busman et al. | ........... | 522/25 |
| 5,723,664 A * | 3/1998 | Sakaguchi et al. | ........... | 564/82 |
| 5,972,862 A * | 10/1999 | Torii et al. | ........... | 510/175 |
| 6,200,736 B1 * | 3/2001 | Tan | ........... | 430/319 |
| 6,252,111 B1 * | 6/2001 | Sakai et al. | ........... | 564/82 |
| 6,280,883 B1 * | 8/2001 | Lamanna et al. | ........... | 429/307 |
| 6,545,109 B2 * | 4/2003 | Lamanna et al. | ........... | 526/220 |
| 6,555,510 B2 * | 4/2003 | Lamanna et al. | ........... | 510/175 |
| 6,863,838 B2 * | 3/2005 | Hamrock | ........... | 252/62.2 |
| 7,015,183 B2 * | 3/2006 | Baik et al. | ........... | 510/176 |
| 7,018,785 B2 * | 3/2006 | Ono et al. | ........... | 430/327 |
| 7,030,067 B2 * | 4/2006 | Lamanna et al. | ........... | 508/568 |

(Continued)

FOREIGN PATENT DOCUMENTS

JP    57-146766    9/1982

(Continued)

OTHER PUBLICATIONS

Foropoulos et al., Nov. 1, 1984, Inorganic Chemistry, vol. 23, No. 23, pp. 3720-3723, "Method of Synthesizing a Sulfonimide represented by the formula of $(CF_3SO_2)_2NH$."*

(Continued)

*Primary Examiner*—Mark Kopec
*Assistant Examiner*—Khanh Tuan Nguyen
(74) *Attorney, Agent, or Firm*—Wenderoth, Lind & Ponack, L.L.P.

(57) ABSTRACT

The invention provides a novel rinsing fluid which can convert an easily wettable resist pattern surface having a contact angle of 40° or below into one having a contact angle of 70° or above to inhibit pattern collapse effectively and thereby give high-quality products. The rinsing fluid consists of a solution containing at least one fluorine compound soluble in water or alcoholic solvents which is selected from among compounds represented by the general formula (I),

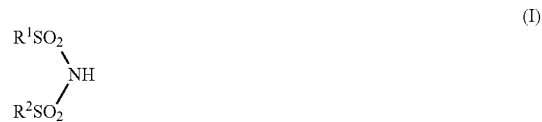

those represented by the general formula (II),

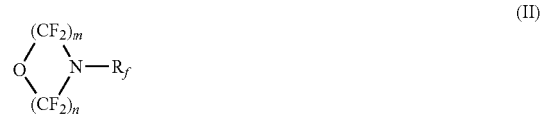

and those represented by the general formula: $R_f'$—COOH: wherein $R^1$ and $R^2$ are each optionally substituted $C_{1-5}$ alkyl whose hydrogen atoms are partially or wholly replaced by fluorine, or $R^1$ and $R^2$ together with the $SO_2$ groups to which they are bonded and the nitrogen atom may form a five- or six-membered ring; $R_f$ is optionally substituted $C_{1-5}$ alkyl whose hydrogen atoms are partially or wholly replaced by fluorine; m and n are each an integer of 2 or 3; and $R_f'$ is at least partially fluorinated alkyl having 8 to 20 carbon atoms.

4 Claims, No Drawings

U.S. PATENT DOCUMENTS

| | | |
|---|---|---|
| 2002/0115022 A1 | 8/2002 | Messick et al. |
| 2003/0051742 A1* | 3/2003 | Boyers .................. 134/30 |
| 2004/0053170 A1 | 3/2004 | Iijima et al. |
| 2005/0101500 A1* | 5/2005 | Baik et al. ............. 510/175 |
| 2005/0261264 A1* | 11/2005 | Yanagida et al. ........ 514/184 |
| 2007/0292808 A1* | 12/2007 | Koshiyama et al. ...... 430/324 |

FOREIGN PATENT DOCUMENTS

| | | |
|---|---|---|
| JP | 5-299336 | 11/1993 |
| JP | 6-163391 | 6/1994 |
| JP | 7-140674 | 6/1995 |
| JP | 7-142349 | 6/1995 |
| JP | 7-226358 | 8/1995 |
| JP | 11-295902 | 10/1999 |
| JP | 2002-323773 | 11/2002 |
| JP | 2003-267900 | 9/2003 |

OTHER PUBLICATIONS

Toshihiko Tanaka et al. "*Mechanism of Resist Pattern Collapse During Development Process*", Japan Appl. Phys., vol. 32 (1993), pp. 6059-6064.

* cited by examiner

RINSING FLUID FOR LITHOGRAPHY

TECHNICAL FIELD

The present invention relates to a rinse solution for lithography capable of effectively preventing pattern falling during formation of a fine pattern having a high aspect ratio.

BACKGROUND TECHNOLOGY

Along with the trend in recent years in the semiconductor devices toward compact size and high integration, development works were practiced for the use of light sources for the fine working including ultraviolet lights such as the g-line and i-line, excimer laser beams such as KrF and ArF and the like as well as photoresist compositions suitable thereto such as, for example, chemical-amplification photoresist compositions while many of the problems on the lithographic technology in this direction are now on the way of solution.

Meanwhile, one of the problems is pattern falling during formation of a fine resist pattern or, in particular, pattern of a high aspect ratio by the lithographic technology. This pattern falling is a phenomenon encountered in the parallel formation of a large number of patterns on a substrate that adjacent patterns are brought near as if leaning each other eventually leading to breaking or exfoliation of the pattern at the base part. If such pattern falling occurs, desirable products can no longer be obtained resulting in a decrease of the product yield and reliability of the products.

Meanwhile, the reason for this pattern falling has already been elucidated [Japanese Journal of Applied Physics, vol. 32 (1993), p. 6059-p. 6064] and is understood to be caused by the surface tension of the rinse solution acting in the course of drying of the rinse solution during the rinse treatment of the resist pattern after development.

Accordingly, no forces to cause pattern falling are produced when the resist pattern is kept immersed in the rinse solution or, namely, during the rinse treatment after development but, in the course of the drying step to remove the rinse solution, forces due to the surface tension of the rinse solution act between the resist patterns leading to resist falling.

Theoretically, therefore, pattern falling could be prevented by using a rinse solution having a small surface tension or, namely, exhibiting a large contact angle so that it was the attempt heretofore to prevent pattern falling by the admixture of the rinse solution with an additive compound capable of decreasing the surface tension or increasing the contact angle.

For example, proposals were made for a rinse solution with addition of isopropyl alcohol (JP6-163391A), a method in which the contact angle between the resist surface after development and the rinse solution is adjusted to be in the range of 60 to 120 degrees by using a mixture pf isopropyl alcohol and water or isopropyl alcohol and a fluorinated ethylene compound as the rinse solution (JP5-2993363A), a method of using a rinse solution having a surface tension adjusted in the range of 30 to 50 dynes/cm by the addition of an alcohol, a ketone or a carboxylic acid for a resist by using a novolac resin or a hydroxypolystyrene resin as the base material of the resist composition (JP7-140674A), a method of adding a fluorine-containing surfactant to at least one of the developer solution and the rinse solution (JP7-142349A), a method comprising a step of rinse with water and a step of drying after replacement with a water-immiscible liquid having a small surface tension and having a larger specific gravity than water such as, for example, a perfluoroalkyl polyether while the resist is kept immersed in water (JP7-226358A), a rinse agent composition containing a nitrogen-containing compound having a molecular weight of 45 to 10000 and having a hydrocarbon group with 1 to 20 carbon atoms and an amino group, imino group or an ammonium group in the molecule (JP11-295902A), a method of using a composition containing a fluorinated carboxylic acid, fluorinated sulfonic acid or a salt thereof as the developer solution (JP2002-323773A), a method of treatment of the developed substrate with an organic treatment agent containing a hydrofluoroether after a rinse treatment (JP2003-178943A and JP2003-178944A) and elsewhere.

With each of these rinse solutions or the rinse treatment methods, however, it is not possible to completely prevent pattern falling and, in addition, a risk of decrease is caused in the properties or, in particular, the precision of the pattern formed thereby so that they are not always satisfactory for industrialization.

On the other hand, the fluorine-containing surfactant used nowadays is perfluorooctane sulfonic acid (PFOS). This substance has a serious problem in handling because it is a "designated chemical substance" within Japan and also is an objective of the Significant novel utilization rules (SNUR) in the United States as an ecological influences-related rule. To say in particular, since the substances under the SNUR regulations may bring about an unreasonable risk to damage the health or environment necessitating wearing of protectors in the working place and education and training of employees with information on the toxicity and so on with a further regulation on the discarding treatment. It is accordingly desired to obtain a fluorine-based surfactant capable of exhibiting equivalent effects as in the use of the perfluorooctane sulfonic acid and containing a fluorine-based surfactant with good handleableness and without environmental problems to replace the perfluorooctane sulfonic acid.

DISCLOSURE OF THE INVENTION

The present invention has been completed with an object to provide a novel rinse solution capable of effectively preventing pattern falling by modifying the surface of a resist pattern highly wettable with a contact angle of 40 degrees or smaller so as to have a contact angle of 70 degrees or larger to be suitable for production of high-quality products.

The inventors have continued extensive investigations in order to develop a rinse solution capable of effectively preventing pattern falling in the course of photoresist pattern formation by the lithographic technology still without causing a decrease in the properties of the resist pattern after the treatment resulting in finding of the fact that, when the treatment is undertaken either before or after the rinse treatment with water by using a fluorine compound-containing solution having a specific functional group, the contact angle against the contacting liquid on the resist pattern surface can be increased to 70 degrees or larger without decreasing the properties of the resist per se to prevent pattern falling leading to completion of the present invention on the base of this discovery.

Namely, the present invention provides a rinse solution for lithography comprising a solution containing at least one kind selected from the fluorine compounds soluble in water or in an alcoholic solvent as represented by the general formula

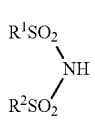
(I)

($R^1$ and $R^2$ in the formula are each an alkyl group or a substituted alkyl group having 1-5 carbon atoms of which a part or all of the hydrogen atoms are substituted by fluorine atoms, $R^1$ and $R^2$ optionally forming a five-membered ring or six-membered ring jointly with the $SO_2$ and N to which both are bonded), the general formula

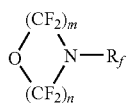
(II)

($R_f$ in the formula is an alkyl group or a substituted alkyl group having 1-5 carbon atoms substituted by fluorine atoms for a part or all of the hydrogen atoms and m and n are each an integer of 2 or 3)

or the general formula

(III)

($R_f'$ in the formula is an at least partly fluorinated alkyl group having 8-20 carbon atoms).

The $R^1$ and $R^2$ in the general formula (I) preferably include alkyl groups or substituted alkyl groups of which all of the hydrogen atoms are substituted by fluorine atoms such as, for example, perfluoroalkyl groups including perfluoromethyl group, perfluoroethyl group, perfluoropropyl group and perfluorobutyl group. Particularly preferable are those in which $R^1$ and $R^2$ jointly as bonded form a five-membered ring or six-membered ring together with the $SO_2$ group and the N atom to which they are bonded and all of the hydrogen atoms in the $R^1$ and $R^2$ are substituted with fluorine atoms such as, for example, a compound expressed by

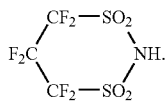

The $R_f$ in the general formula (II) is an at least partly fluorinated alkyl group or substituted alkyl group having 1-5 carbon atoms. The substituent group in this substituted alkyl group is exemplified by hydroxyl group, alkoxy group, carboxyl group and amino group. A particularly preferable $R_f$ is a totally fluorinated one.

Such a compound is exemplified, for example, by perfluoro (3-morpholinopropionic acid), perfluoro(2-methyl-3-morpholinopropionic acid), perfluoro(4-morpholino butyric acid) and the like, of which particularly preferable is perfluoro(2-methyl-3-morpholinopropionic acid) expressed by the formula

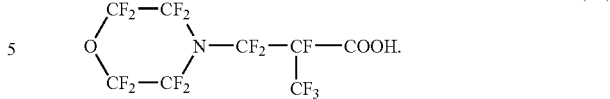
(IV)

These fluorine compounds can be prepared by fluorinating a starting unfluorinated compound in a known method such as, for example, the electrolytic fluorination method. Besides, lithium salts of those of the general formula (I) in which the $R^1$ and $R^2$ are each a trifluoromethyl group or a pentafluoroethyl group are commercially available under a registered tradename of "Fluorad".

Further, the fluorine compound represented by the general formula (III) can be exemplified by decane carboxylic acid, dodecane carboxylic acid, tetradecane carboxylic acid and hexadecane carboxylic acid substituted by fluorine atoms for a part or all of the hydrogen atoms, of which particularly preferable are those of which all of the hydrogen atoms are substituted by fluorine atoms such as, for example, perfluoro (decane carboxylic acid).

These fluorine compounds are used usually in the form of a solution as dissolved in water or in a mixture of water and an alcoholic solvent such as, for example, methyl alcohol or ethyl alcohol.

Since fluorine compounds of a higher fatty acid are insoluble in water, it is necessary to use a mixed solvent of, for example, water and an alcoholic solvent such as methyl alcohol, isopropyl alcohol and trifluoroethanol. The mixing proportion of water and the alcoholic solvent is in the range from 60:40 to 99:1 by the volume ratio.

Thus, the rinse solution of the present invention is prepared by dissolving the fluorine compound of the general formulas (I) to (III) in water or in a mixed solvent of water and an alcoholic solvent in a concentration of 0.001 to 5.0% by mass or, preferably, 0.01 to 1.0% by mass.

The treatment of the resist pattern with this rinse solution is conducted by dipping the resist pattern still wet after the development treatment in the rinse solution or by coating or spraying the surface of the resist pattern with the rinse solution. By this treatment, the contact angle of the resist pattern surface against the solution, which may occasionally be so small as to be 40 degrees or smaller, can be increased so large as to be 70 degrees or larger or eventually 90 degrees or larger so that drying can be effected without pattern falling by conducting a drying treatment under this condition by means of spin drying and the like.

In the course of the treatment of the resist pattern with this rinse solution, it is optional according to desire to increase the temperature of the rinse solution. Since the surface tension of water, which is 72 dynes/cm at 24° C., can be decreased to 62.6 dynes/cm at 80° C., pattern falling can further be decreased by increasing the temperature.

BEST MODE FOR CARRYING OUT THE INVENTION

In the following, best modes are described by way of examples for practicing the present invention although the present invention is never limited by these examples.

An antireflection film having a film thickness of 77 nm was formed on a silicon wafer by coating with an antireflection filming agent (produced by Brewer Science Inc., product name ARC 29A) followed by a heating treatment at 215° C. for 60 seconds. This antireflection film was coated with a chemical-amplification positive-working photoresist prepared by dissolving a resinous ingredient expressed by the formula

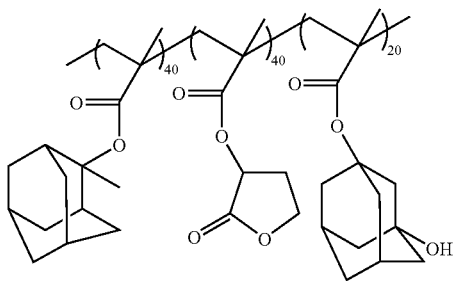

and, relative to the resinous ingredient, 3.0% by mass of triphenylsulfonium perfluorobutane sulfonate and 0.35% by mass of triethanolamine in a mixed solvent of propyleneglycol monomethylether acetate and propyleneglycol monomethyl ether (mixing proportion=6:4) to give an overall solid concentration of 11% by mass to form a photoresist film of 460 nm film thickness.

Onto the substrate having the thus formed photoresist film, a light-exposure treatment was conducted with a light of 193 nm wavelength by using an ArF excimer stepper (a product by Nikon Corp., product name NSR-S302A) followed by a heating treatment at 130° C. for 90 seconds.

Thereafter, a development treatment was conducted at 23° C. taking 60 seconds by using a 2.38% aqueous solution of tetramethylammonium hydroxide.

In the next place, the thus obtained line-and-space (110 nm/150 nm) pattern was treated with a 0.1% aqueous solution of a water-soluble resin obtained by copolymerizing an equal-amounts mixture of vinyl pyrrolidone and vinyl imidazole to form a resist pattern having a surface with a contact angle of 25 degrees to water.

EXAMPLES 1-3

The resist patterns obtained in the Reference Example were subjected to a rinse treatment by using 3 kinds of rinse solutions including 0.005% aqueous solutions of perfluoro (2-methyl-3-morpholino propionic acid (a product by Jemco Inc., product name PFMO3, referred to hereinbelow as PFMO3), bis(heptafluoropropylsulfonyl)amine (a product by Jemco Inc., product name EF-N331, referred to hereinbelow as EF-N331) and perfluoro(decane carboxylic acid) obtained on the market (referred to hereinbelow as PDC).

A mixed solvent of water and trifluoroethanol (volume proportion 99:1) was used as the solvent for PDC since this was insoluble in water.

This rinse treatment was conducted by dripping the aforementioned rinse solutions for 3 seconds at 500 rotations followed by rinse for 20 seconds with pure water.

The contact angles of the resist pattern surface before and after each rinse solution treatment were determined by using a contact angle tester (a product by Kyowa Interface Science Co., product name CA-X150). The results are shown in Table 1.

TABLE 1

| Example | Fluorine compound in rinse solution | Contact angle, degrees | |
|---|---|---|---|
| | | Before treatment | After treatment |
| 1 | PFMO3 | 25 | 103 |
| 2 | EF-N331 | 25 | 95 |
| 3 | PDC | 25 | 105 |

Further, the respective substrates after the treatment were examined with an SEM (scanning electron microscope) to find that absolutely no pattern falling and the like could be noted on the substrate surfaces.

Comparative Example

Rinse treatments were undertaken in just the same manner as in Example 1 by using pure water or isopropyl alcohol as the rinse solution to note absolutely no increase in the contact angle which remained at 25 degrees. Further, the substrates after the treatment were examined with an SEM (scanning electron microscope) to detect resist pattern falling occurring in a considerable probability.

INDUSTRIAL UTILIZABILITY

By using the rinse solution of the present invention, it is possible to form a pattern without any pattern falling and still without any decrease in the characteristics of the pattern properties even in the cases where the resist pattern to be formed is very fine as a line-and-space resist pattern of 30 to 100 nm and, in particular, having a high aspect ratio of 3 or larger to be highly liable to pattern falling. Accordingly, the present invention can be satisfactory in the manufacture of semiconductor devices such as LSIs, ULSIs and the like utilizing the lithographic method or, in particular, in the manufacture of devices having a high aspect ratio.

The invention claimed is:

1. A rinse solution for lithography consisting essentially of a compound of the formula

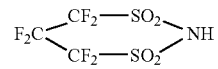

in a solvent which is a mixture of water and an alcoholic solvent.

2. A rinse solution for lithography consisting essentially of a compound of the formula

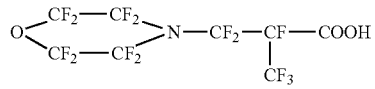

in a solvent which is a mixture of water and an alcoholic solvent.

3. The rinse solution for lithography described in claim 1 wherein the ratio of water to alcoholic solvent is from 60:40 to 99:1 by volume.

4. The rinse solution for lithography described in claim 2 wherein the ratio of water to alcoholic solvent is from 60:40 to 99:1 by volume.

* * * * *